(12) United States Patent
Dhekial-Phukan et al.

(10) Patent No.: US 11,869,754 B2
(45) Date of Patent: Jan. 9, 2024

(54) DYNAMIC PRESSURE CONTROL FOR PROCESSING CHAMBERS IMPLEMENTING REAL-TIME LEARNING

(71) Applicant: Applied Materials, Inc., Santa Clara, CA (US)

(72) Inventors: Tina Dhekial-Phukan, Milpitas, CA (US); Michael Nichols, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1004 days.

(21) Appl. No.: 16/563,352

(22) Filed: Sep. 6, 2019

(65) Prior Publication Data

US 2021/0074526 A1 Mar. 11, 2021

(51) Int. Cl.
*H01J 37/32* (2006.01)
*H01L 21/67* (2006.01)
*C23C 16/455* (2006.01)
*C23C 16/52* (2006.01)

(52) U.S. Cl.
CPC .. *H01J 37/32816* (2013.01); *C23C 16/45557* (2013.01); *C23C 16/52* (2013.01); *H01J 37/32449* (2013.01); *H01J 37/32926* (2013.01); *H01J 37/32981* (2013.01); *H01L 21/67253* (2013.01)

(58) Field of Classification Search
CPC ......... H01L 21/67253; C23C 16/45557; C23C 16/505; C23C 16/52; H01J 37/32449; H01J 37/32816; H01J 37/32926; H01J 37/32981
See application file for complete search history.

(56) References Cited

U.S. PATENT DOCUMENTS

2005/0189070 A1* 9/2005 Tanaka ............... H01L 21/67248
156/345.37
2013/0119016 A1* 5/2013 Kagoshima ........ G05B 19/4184
156/345.24

* cited by examiner

*Primary Examiner* — Yuechuan Yu
(74) *Attorney, Agent, or Firm* — Kilpatrick Townsend & Stockton LLP

(57) ABSTRACT

System and methods of improving dynamic pressure response during recipe step transitions. An exemplary method may include changing at least one of a plurality of recipe parameters in accordance with a processing recipe while running the processing recipe on a semiconductor substrate in a processing chamber. The method may further include measuring a pressure response in the processing chamber responsive to the changing of the at least one of the plurality of recipe parameters, and determining a response error based on the pressure response and a model pressure response calculated based on the processing recipe. The method may further include, in response to determining that the response error may be greater than a threshold value, calculating an adjustment to an operation of a valve downstream of the processing chamber when changing the at least one of the plurality of recipe parameters in accordance with the processing recipe in subsequent runs.

18 Claims, 5 Drawing Sheets

DYNAMIC PRESSURE CONTROL FOR PROCESSING CHAMBERS IMPLEMENTING REAL-TIME LEARNING

TECHNICAL FIELD

The present technology relates to semiconductor processes and equipment. More specifically, the present technology relates to semiconductor processing chambers and systems and methods for controlling the chamber pressure.

BACKGROUND

Integrated circuits are made possible by processes which produce intricately patterned material layers on substrate surfaces. As device sizes continue to shrink in next-generation devices, and uniformity of processing conditions continues to increase in importance, chamber designs and system set-up may have an important role in the quality of devices produced. Thus, there is a need for systems and methods that can be used to produce high quality devices and structures.

SUMMARY

Embodiments of the present technology may include methods of improving dynamic pressure response during recipe step transitions. In some embodiments, a method may include changing at least one of a plurality of recipe parameters in accordance with a processing recipe while running the processing recipe on a first semiconductor substrate in a processing chamber. The method may further include measuring a first pressure response in the processing chamber responsive to the changing of the at least one of the plurality of recipe parameters in accordance with the processing recipe. The method may also include determining a first response error based on the first pressure response and a model pressure response calculated based on the processing recipe. The method may further include, in response to determining that the first response error may be greater than a threshold value, calculating an adjustment to an operation of a valve downstream of the processing chamber to be applied when changing the at least one of the plurality of recipe parameters in accordance with the processing recipe in a subsequent run of the processing recipe.

In some embodiments, the method may further include generating a plasma in the processing chamber in accordance with the processing recipe. The at least one of the plurality of recipe parameters may include an RF power of the plasma generated in the processing chamber. In some embodiments, the method may further include flowing a process gas into the processing chamber in accordance with the processing recipe. The at least one of the plurality of recipe parameters may include a flow rate of the processing gas flowed into the processing chamber.

In some embodiments, the method may further include running the processing recipe on a second semiconductor substrate in the processing chamber. The method may also include changing the at least one of the plurality of recipe parameters in accordance with the processing recipe being run on the second semiconductor substrate. The method may further include applying the adjustment to the operation of the valve when changing the at least one of the plurality of recipe parameters in accordance with the processing recipe being run on the second semiconductor substrate. The adjustment to the operation of the valve may be applied without changing the processing recipe.

In some embodiments, the method may also include measuring a second pressure response in the processing chamber responsive to the changing of the at least one of the plurality of recipe parameters in accordance with the processing recipe being run on the second semiconductor substrate and the application of the adjustment to the operation of the valve. The method may further include determining a second response error based on the second pressure response and the model pressure response. In some embodiments, the method may further include, in response to determining that the second response error may be greater than the threshold value, calculating another adjustment to be made to the operation of the valve when changing the at least one of the plurality of recipe parameters in accordance with the processing recipe in another subsequent run of the processing recipe. In some embodiments, a settling time of the second pressure response may be less than a settling time of the first pressure response. In some embodiments, an overshoot of the second pressure response may be less than an overshoot of the first pressure response.

Embodiments of the present technology may include semiconductor processing systems. In some embodiments, a semiconductor processing system may include a processing chamber, a valve downstream of the processing chamber, and a control system. In some embodiments, the valve may be operable to change a pressure of the processing chamber. In some embodiments, the control system may be configured to receive measurements indicative of a first pressure response in the processing chamber responsive to changing of at least one of a plurality of recipe parameters in accordance with a processing recipe being run on a first semiconductor substrate. The control system may be further configured to determine a first response error based on the first pressure response and a model pressure response calculated based on the processing recipe. The control system may also be configured to, in response to determining that the first response error may be greater than a threshold value, calculate an adjustment to an operation of the valve to be applied when changing the at least one of the plurality of recipe parameters in accordance with the processing recipe in a subsequent run of the processing recipe.

In some embodiments, the semiconductor processing system may further include a fast update communications interface. The fast update communications interface may be configured to communicate the measurements indicative of the first pressure response in the processing chamber to the control system. The fast update communications interface may be further configured to communicate a control signal from the control system to apply the adjustment to the operation of the valve. In some embodiments, the at least one of the plurality of recipe parameters may include at least one of an RF power of a plasma generated in the processing chamber or a flow rate of a processing gas flowed into the processing chamber. In some embodiments, the control system may be further configured to activate an actuator of the valve to apply the adjustment to the operation of the valve when changing the at least one of the plurality of recipe parameters in accordance with the processing recipe being run on a second semiconductor substrate. In some embodiments, the adjustment to the operation of the valve may be applied without changing the processing recipe.

In some embodiments, the control system may be further configured to receive measurements indicative of a second pressure response in the processing chamber responsive to the changing of the at least one of the plurality of recipe parameters in accordance with the processing recipe being run on the second semiconductor substrate and the application of the adjustment to the operation of the valve. In some embodiments, the control system may be further configured to determine a second response error based on the second pressure response and the model pressure response. In some embodiments, the control system may be further configured to, in response to determining that the second response error may be greater than the threshold value, calculate another adjustment to be made to the operation of the valve when changing the at least one of the plurality of recipe parameters in accordance with the processing recipe in another subsequent run of the processing recipe.

Embodiments of the present technology may include one or more non-transitory machine readable media having instructions stored thereon. In some embodiments, the instructions may be executable by one or more processors of a control system of a processing chamber to cause the control system to receive measurements indicative of a first pressure response in the processing chamber responsive to changing of at least one of a plurality of recipe parameters in accordance with a processing recipe being run a first semiconductor substrate. The instructions may be executable by the one or more processors of the control system of the processing chamber to further cause the control system to determine a first response error based on the first pressure response and a model pressure response calculated based on the processing recipe. The instructions may be executable by the one or more processors of the control system of the processing chamber to further cause the control system to, in response to determining that the first response error may be greater than a threshold value, calculate an adjustment to an operation of a valve downstream of the processing chamber to be applied when changing the at least one of the plurality of recipe parameters in accordance with the processing recipe in a subsequent run of the processing recipe.

In some embodiments, the instructions may be executable by the one or more processors of the control system to further cause the control system to cause the processing chamber to generate a plasma in the processing chamber in accordance with the processing recipe. In some embodiments, the at least one of the plurality of recipe parameters may include an RF power of the plasma generated in the processing chamber. In some embodiments, the instructions may be executable by the one or more processors of the control system to further cause the control system to activate an actuator of the valve to applying the adjustment to the operation of the valve when changing the at least one of the plurality of recipe parameters in accordance with the processing recipe being run on a second semiconductor substrate. In some embodiments, the adjustment to the operation of the valve may be applied without changing the processing recipe.

The present technology may provide numerous benefits over conventional systems and techniques. For example, the present technology may reduce pressure oscillations and the associated settling time during recipe step transitions, which may in turn lead to improvements in the processing throughput. Additionally, by implementing real-time learning of errors that may be present in the pressure response in each chamber, the present technology may allow for matching of the pressure response across multiple chambers even if the chambers may have hardware variabilities. These and other embodiments, along with many of their advantages and features, may be described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
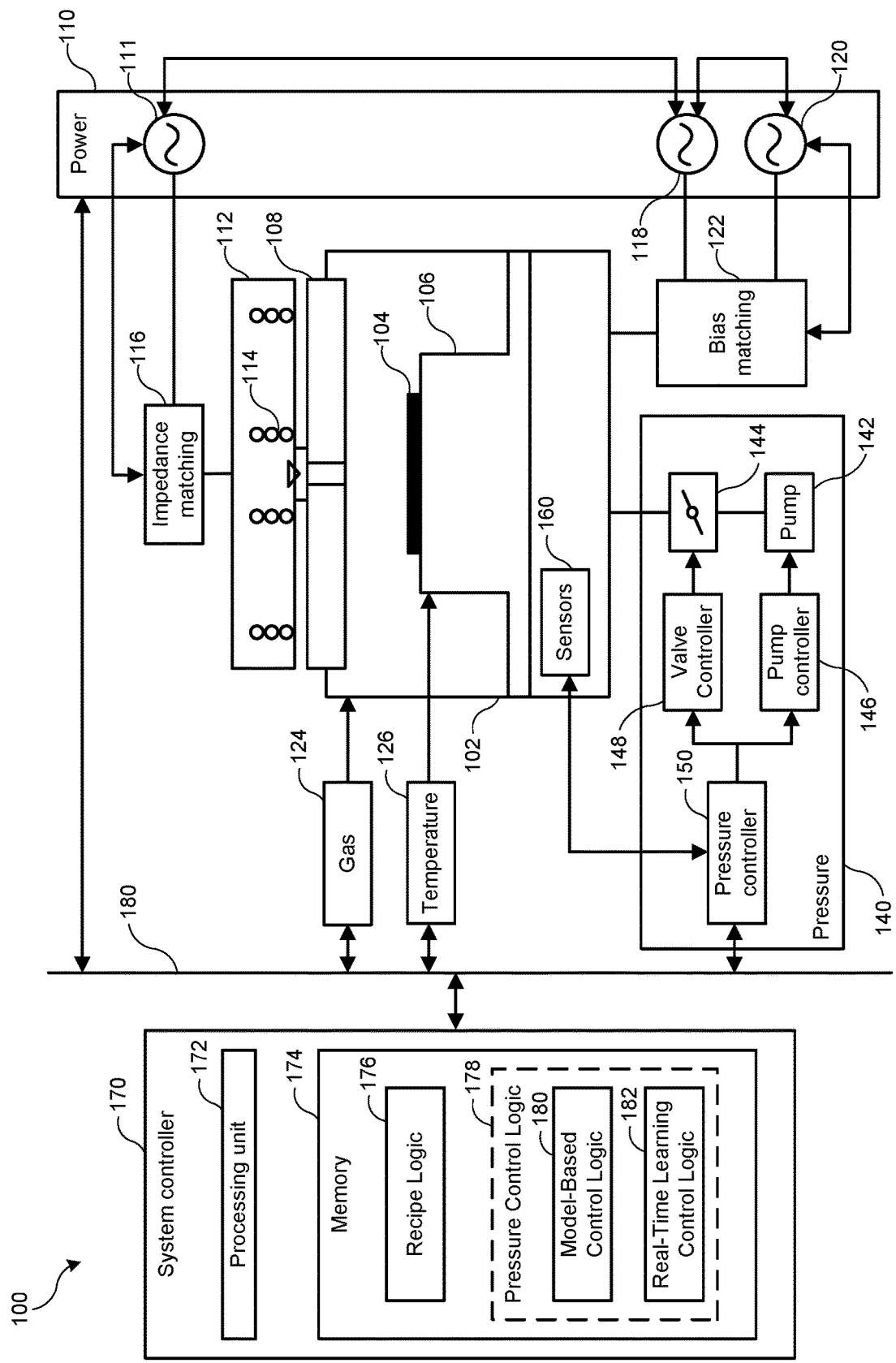
FIG. 1 schematically illustrates a processing system according to embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During manufacturing of semiconductor devices, a processing recipe may include multiple recipe steps. At the transition between recipe steps, one or more recipe parameters, such as gas chemistry, flow rate, RF power, mode of power delivery, pressure set-point, etc., may change. A change in gas/gas-mixture flowrate and/or pressure set-point when transitioning between two recipe steps can cause a chamber pressure control system to respond by moving the chamber valve, such as a throttle valve, from the previous steady state position to a new equilibrium position. The pressure control system may manage, command, direct, and regulate the behavior of the chamber pressure control devices, which may include a manometer assembly, e.g., pressure gauges and pressure switches, the chamber throttle valve, and a pump, such as a turbo molecular pump.

Existing pressure control systems may include a model-based system for pressure control, which may include a built-in flow feedforward model in the pressure control system. The model-based pressure control may utilize a flow feedforward input from the system to generate a signal that may command the controller to affect a change in the chamber throttle valve behavior in response to the changes in gas/gas-mixture flowrate and/or pressure set-point, to reach a new steady state or equilibrium pressure set-point in the chamber. The signal generated may correspond to an expected or desired behavioral response of the pressure that may be an output of the model.

The model-based system may not necessarily provide for a deterministically perfect response, since an etch chamber pressure response may be a highly non-linear system. The model is an approximation that may account for only a limited number of variables when delivering the expected behavioral signal, whereas the dynamic pressure response can be a highly non-linear system. Stated differently, approximations may be used in the model with a limited number of process variables to sustain computational speed for the process, whereas, in reality, multiple process parameters, e.g., RF power, current ratio, flowrate, gas chemistry, pressure set-point, etc., can change during a recipe step change and can inject a non-linear disturbance into the system. These changes can all impact the pressure response that may be almost impossible to model deterministically in the intractably large parameter space of multiple process recipe parameter combinations. In other words, the system may be disturbed by changes to any number of process variables during the period of recipe step transition. The model may not account for the un-modeled variables, and as a result there may be a system error that may go unaccounted for. This system error may manifest as a deviation in the real pressure response from the expected model behavior or set-point as the system may progress through the recipe step transition in time.

These system errors in the pressure response may lead to pressure transients, e.g., pressure waves or oscillations, during the recipe step transitional period, which may be short-lived, but they can increase the time required for the pressure to eventually stabilize to steady state. The type of disturbance that can be injected into the system due to process parameter changes can span the intractably large parameter space of multiple process parameter combinations, whereas the "flow disturbance" anticipated by the pressure model may be defined by a few limited flow feedforward inputs. Therefore, the reference or command input that the pressure model may send for the servo-mechanism to follow may not completely anticipate and correct for every kind of disturbance to the system during the transition phase when the state of the chamber system may be in flux, and hence resulting in the presence of pressure errors.

During the period when the controller may try to match the system response to the model-predicted changes in throttle valve motion, the change may be accompanied by transitory valve oscillations that may ultimately manifest as the pressure transients. This may be because the system may try to adjust and realize the appropriate valve position for attaining the new equilibrium position that may correlate to the new pressure set-point, or the correct valve position that may maintain the desired pressure for the new gas flowrate. However, because of the uncertainty associated with the dynamic response due to the injection of a complex non-linear disturbance, there may always be position overshoot occurring when the valve may be moved to achieve an equilibrium position. This behavior may be comparable to an underdamped system where the initial high speed of valve motion may cause it to go past the estimated target, and this may then be rectified. This may happen a few times as the destination may be passed by each time until after some settling time, when the valve may finally reach the destination. This transient behavior may be repeated every time the step transition occurs, irrespective of the number of times the recipe may be run.

Pressure transients, when process parameters change during a step transition, can be undesirable. Depending on how large or small the flow set-point and/or pressure set-point change may be from the previous step, the direction of pressure change, the type of gas chemistry change between two steps, the RF power state change, etc., the pressure transients can be of varying magnitude with varied settling times. The ideal case would be to model these pressure transients to predict and guide the pressure control system to minimize pressure transition time. Practically speaking, there may be insurmountable challenges to modeling pressure transients that can be used in a predictive manner, given the huge number of changes possible as well as the huge number of combinations of process parameters.

As already mentioned above, an additional settling time resulting from the formation of pressure transients may lead to longer pressure stabilization times, may add to the recipe throughput time overhead, and may place a restriction on the lower bound (~2.5-3 s or more) of how fast recipe steps can transition. Additionally, pressure transients can cause undesirable RF reflected power, and in some cases, can also cause plasma instability.

Despite the availability of huge amounts of data of past runs for any given recipe, it can be challenging to learn from past runs to improve the performance to reduce the pressure errors and to minimize the response time. This information on the past performance of the system may simply be lost. An opportunity for improving the performance proactively and being able to react to changes may also be lost. Since existing systems may not react and adjust to any changes, these changes may sometimes go unaccounted for and the chamber may drift over time.

An existing default approach to optimizing pressure transitions may involve the direct participation of the process engineer. Since every process recipe may have its own unique specifications, no two transitions even within the same recipe may be alike. So, the process engineer may need to characterize the individual steps, understand how the various tool sub-systems may interact with the process, and work under heavy limitations of how far the pressure transition can be optimized by varying other process parameters including the step time. Recipe throughput time improvement and manual pressure transition optimization may often work at odds with each other. Every sub-system may have its unique lower limits of how fast it can respond, and the fundamental response times may be different for each of the subsystems.

In existing systems, there may be no direct way that the user can affect the pressure control. There may only be indirect methods that can be employed for the optimization of dynamic pressure response, and these optimization attempts may include incorporation of changes in other recipe parameters. To reduce the recipe throughput time, manually changing process parameters other than pressure set-points can have undesirable effects for on-wafer performance. If the chamber volume cannot be changed, if the pressure response stabilization may be delayed due to finite chamber volume, and if gas filling times cannot be changed, then the user may go through inordinate lengths of multiple process development stages if recipe throughput time improvement becomes a priority. This manual intervention of characterization and multiple rounds of process optimization may be repeated for each process recipe and step because there may be virtually no way to predict what to change for any given recipe. Once a pressure transition scheme may be identified for a process, this transition scheme may not be transferable to another process having a different set of process parameters.

Another area where the dynamic pressure response may be optimized may include chamber matching. One of the main goals of chamber matching may include matching system response output between various chambers with identical hardware and firmware/software configuration. Due to variabilities in hardware and tool manufacturing precision, matching a system output like the dynamic response of chamber pressure across multiple chambers may be a very difficult task. The problem may also be compounded by variabilities in communication delays for different sub-systems of the tool, the responses of which may all be interconnected as they rely on some common communication protocol during wafer processing, as well as by the existence of a run-to-run spread in time of a response change for a given sub-system.

The present technology overcomes these issues by implementing real-time learning of the dynamic pressure response during recipe step transitions to improve chamber dynamic pressure response for chamber matching and throughput time improvement. The real-time learning may include real-time pressure response data acquisition and analysis of the acquired data. By comparing the acquired data indicative of the real-time dynamic pressure response to an expected behavior input from a pressure-base model, feedback or information on the pressure response errors may be obtained. Based on such feedback, algorithms and/or optimization techniques may be applied to rectify the flow disturbance injected to the system. The pressure-based model may create the initial reference signal for the pressure to respond to a change. The real-time logic may learn the errors in pressure response when the state of the system may be in flux during recipe step change. Those errors learnt from previous runs may be rectified in subsequent run, until an optimal threshold efficiency may be met.

Although the remaining disclosure will routinely identify a plasma chamber utilizing the disclosed technology, it will be readily understood that the systems and methods are equally applicable to a variety of other semiconductor processing chambers. Accordingly, the technology should not be considered to be so limited as for use with the described chamber alone. The present technology may be used with various other chambers that may or may not be configured to generate a plasma to perform real-time learning and/or optimization of the dynamic pressure response.

FIG. 1 schematically illustrates a processing system 100 according to embodiments of the present technology. The processing system 100 may include a processing chamber 102. The processing system 100 may be or may include a plasma processing system configured to generate a plasma inside the processing chamber 102 for processing a substrate 104 supported by a substrate support 106 inside the processing chamber 102. In some embodiments, the substrate support 106 may include an electrostatic chuck or the like. In some embodiments, the processing chamber 102 may further include a dielectric window 108. The dielectric window 108 may be an integrated portion of the processing chamber 102 in some embodiments, or may be a separate, distinct component that may be affixed or mounted to the processing chamber 102 in some embodiments.

RF power may be used to form a plasma in the processing chamber 102 for plasma processing, such as reactive ion etching, plasma-enhanced chemical vapor deposition, plasma-assisted cleaning, and various other semiconductor processing that may utilize a plasma. In some embodiments, the processing system 100 may include a power sub-system 110. The power sub-system 110 may include an RF power source 111 for providing a biasing potential via an upper electrode 112 to the processing chamber 102. The upper electrode 112 may include a number of coils 114 operably coupled to the processing chamber 102. In some embodiments, the processing system 100 may also include an impedance matching sub-system 116 between the RF power source 111 and the upper electrode 112 for coupling of the RF power to the processing chamber 102 to energize the plasma. The power sub-system 110 may further include an RF power source 118 and an RF power source 120 each for providing a biasing potential to the processing chamber 102.

In some embodiments, the RF power sources 118, 120 may be operably coupled to the substrate support 106 via a bias matching sub-system 122. The substrate support 106 may operate as an electrode. The RF power source 118 and/or the RF power source 120 may provide the biasing potential to the processing chamber 102 via the substrate support 106 to energize the plasma.

In some embodiments, the processing system 100 may include a gas delivery sub-system 124 configured to deliver one or more processing gases to the processing chamber 102. The gas delivery sub-system 124 may include one or more mass flow controllers (MFCs) configured to control the flow of the one or more processing gases. The gas delivery sub-system 124 may further include one or more flow ratio controller(s) (FRCs) configured to control a flow ratio of two or more gases. In some embodiments, the processing system 100 may also include a temperature sub-system 126 configured to adjust the temperature of the substrate support 106.

In some embodiments, the processing system 100 may further include a pressure sub-system 140 configured to control the pressure inside the processing chamber 102 and to flow exhaust from the processing chamber 102. The pressure sub-system 140 may include a pump 142, such as a turbo molecular pump. The pressure sub-system 140 may further include a valve 144, such as a throttle valve, disposed downstream of the processing chamber 102 for providing fluid access from the processing chamber 102 to the pump 142. In some embodiments, the pump 142 and the valve 144 may be controlled by a pump controller 146 and a valve controller 148, respectively. The pump controller 146 and the valve controller 148 may be controlled by a pressure controller 150. The pump controller 146 and the valve controller 148 may control the operation of the pump 142 and the valve 144, respectively, via respective actuators. In some embodiments, the functionality and/or software and/or hardware components of the pump controller 146 and/or the valve controller 148 may be integrated into the pressure controller 150. The pressure sub-system 140 may include one integrated controller for controlling the various components, e.g., pump 142, valve 144, actuators, etc., of the pressure sub-system 140. The pressure sub-system 140 may further include a manometer assembly, which may include pressure gauges, pressure switches, and/or pressure transducers, configured to measure the pressure at one or more locations of pressure sub-system 140.

The processing system 100 may further include various sensors 160 configured to take measurements indicative of various operating conditions inside the processing chamber 102, such as pressure, temperature, etc. Although the sensors are indicated by a single block 160 in FIG. 1, the processing system 100 may include multiple sensors, and the sensors may be disposed at separate locations within the processing chamber 102 appropriate for taking various measurements. The sensors 160 may be configured to provide relevant measurements or data to the respective sub-systems described herein. Each of the sub-systems may include a controller configured to receive relevant sensor data. For example, the pressure sub-system 140 may include the pressure controller 150 as discussed above configured to receive pressure sensor data. The controllers of the various sub-systems may be further configured to communicate the sensor data to a system controller 170 of the processing system 100 via a communication interface 180. The system controller 170 may analyze the sensor data received, and provide control signals to one or more of the controllers of the various sub-systems via the communications interface 180.

In some embodiments, the communications interface 180 may include a centralized communications interface configured to facilitate communication between the system controller 170 and the various sub-systems of the processing system 100. The communications interface 180 may be implemented as a digital communications interface, an analog communications interface, and/or a combination of digital and analog communications interfaces. The communications interface 180 may be configured to achieve a fast update communications interface among the various controllers using any appropriate protocols to achieve a short data update time, such as less than or about 100 µs, less than or about 80 µs, less than or about 60 µs, less than or about 40 µs, less than or about 20 µs, or less in various embodiments. The short data update time may allow synchronization of the signals transmitted over the communications interface 180, such as signals from the system controller 170 to each sub-system, so as to minimize delays and/or run-to-run variability.

Specifically, the system controller 170 may be configured to receive a processing recipe for carrying out various semiconductor processes and may be configured to control the operation of the various sub-systems based on the processing recipe received. By implementing the appropriate communications protocol and the associated hardware and/or software to achieve a short data update time, the variation in time delays associated with transmission of control signals, e.g., control signals related to changes in processing recipe parameters during recipe step transitions, from the system controller 170 to the sub-systems may be reduced. Stated differently, the transmission of the control signals from the system controller 170 to the various sub-systems may be synchronized. Reduced variation in time delays associated with transmission of the control signals and/or the synchronization thereof may further lead to high fidelity or reduced run-to-run variability among repeated runs of a processing recipe.

Due to the reduced or minimal run-to-run variability, any errors, such as errors associated with a dynamic pressure response in the processing chamber 102 or deviations from a model pressure response during each run of the processing recipe, may be highly repeatable from run to run. Thus, the system controller 170 may be configured to learn the pressure response in real time from a single run of a processing recipe. The term real time is used here to refer to taking measurements of the pressure inside the processing chamber 102 while running the recipe. The system controller 170 may then determine the pressure response errors and/or deviations from the model pressure response because the errors and/or deviations learned from the single run would likely be repeated in subsequent runs if no adjustments are made. The system controller 170 may be further configured to adjust the operation of the pressure sub-system 140 based on the learned errors and/or deviations to optimize the pressure response in subsequent runs, in particular to optimize the dynamic pressure response during recipe step transitions.

To implement the various functionalities and operations described herein, including the real-time learning and/or optimization of the pressure response, the system controller 170 may include a processing unit 172 and a memory 174. The processing unit 172 may include without limitation one or more general-purpose processors, one or more special-purpose processors (e.g., application specific integrated circuits (ASICs), and/or the like), reprogrammable circuitry, and/or other processing structure or means, which can be configured to cause the system controller 170 and/or the controllers of the sub-systems to perform the functionalities as described herein. The processing unit 172 may also be configured to collect data, such as real-time pressure date, and to process and to analyze the collected data.

The memory 174 may include non-transitory machine readable media. Such a medium may take many forms, including, but not limited to, non-volatile media, volatile media, and transmission media. Common forms of computer-readable media include, for example, magnetic and/or optical media, any other physical medium with patterns of holes, a RAM, a PROM, EPROM, a FLASH-EPROM, any other memory chip or cartridge, or any other medium from which a computer can read instructions and/or code. The memory 174 may include stored thereon instructions or code executable by the processing unit 172 for implementing the various functionality and operations described. In some embodiments, the memory 174 may include a recipe logic 176 and a pressure control logic 178.

The recipe logic 176 may include instructions or code executable by the processing unit 172 to implement a calibration program and an user interface for implementing the real-time learning of and/or the optimization of the pressure response in the processing chamber 102 for a given processing recipe. The user interface may be configured to receive user input indicating whether to run the calibration program for a given recipe. In some embodiments, the calibration program may allow for one or more recipe steps of a processing recipe to be selected by the user for implementing the real-time learning and/or optimization of the pressure response in the processing chamber 102. Once the pressure response may be learned and/or optimized, the optimized parameters for the pressure controller 150 may be updated for subsequent runs of the given processing recipe.

The pressure control logic 178 may include model-based control logic 180. The model-based control logic 180 may include instructions or code executable by the processing unit 172 to generate a control signal for the pressure control 150 to effectuate a change in the operation and/or behavior of the valve 144. The operation and/or behavior of the valve 144 may be changed in response to one or more changes in the recipe parameters, such as a change in the gas flow rate, a change in the pressure set-point, a change in the RF power, etc. The operation and/or behavior of the valve 144 may be changed so as to reach a new steady or equilibrium state in the processing chamber 102.

The pressure control logic 178 may further include real-time learning control logic 182. The real-time learning control logic 182 may include instructions or code executable by the processing unit 172 for real-time learning and/or optimization of the dynamic pressure response in the processing chamber 102 when one or more recipe parameters may be changed during recipe step transitions. As mentioned above, the model-based control logic 180 may create an initial reference signal, based on an approximation that may account for only a limited number of variables for the pressure sub-system 140 to respond to a change in one or more recipe parameters. The real-time learning control logic 182 may learn any error in the pressure response and may modify the behavior of pressure sub-system 140 to reduce those errors in subsequent runs as will be discussed in more detail below.

Figure 2:
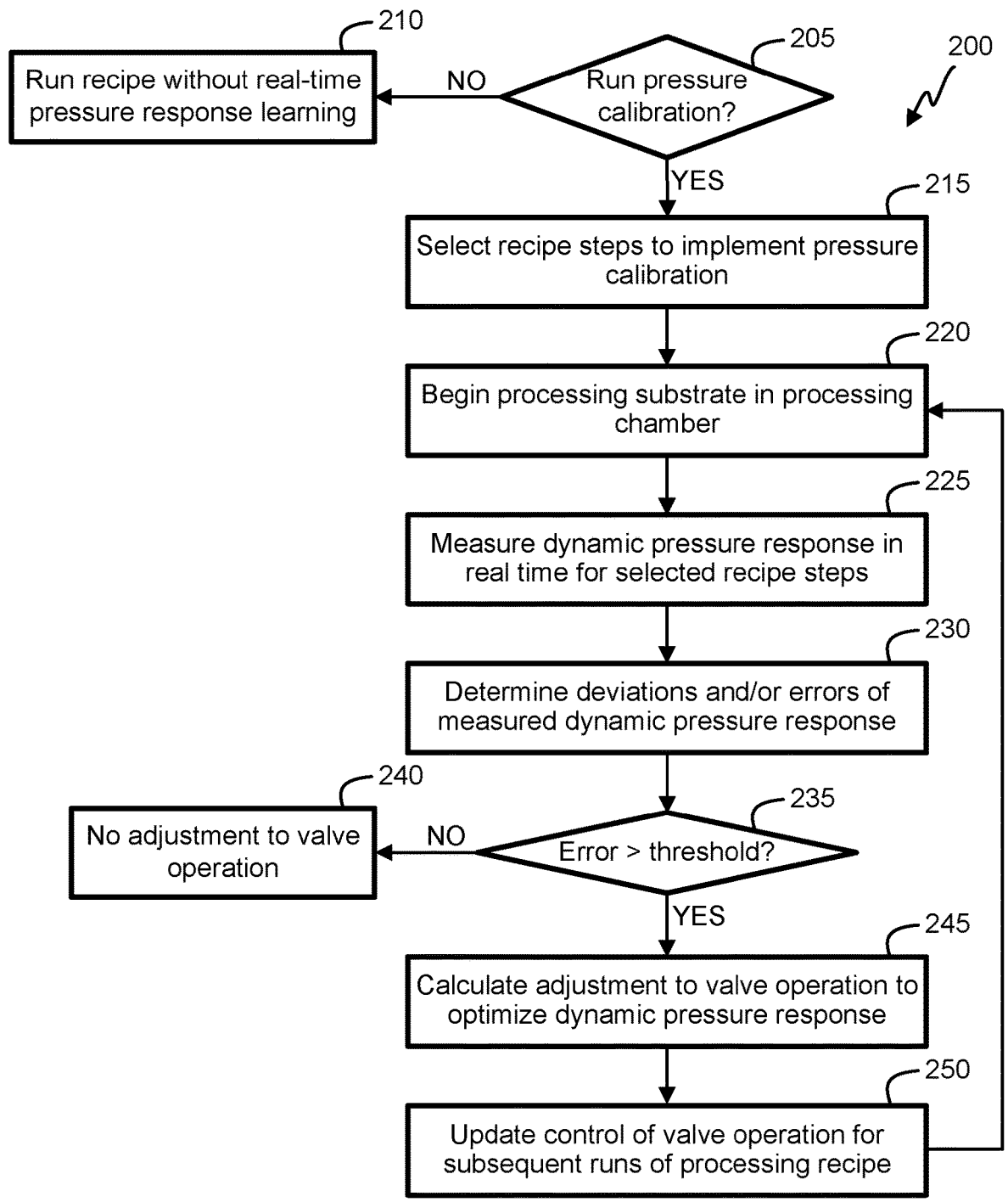
FIG. 2 shows a flow chart illustrating the functionality of implementing real-time learning and/or optimization of a pressure response according to embodiments of the present technology.

FIG. 2 shows a flow chart 200 illustrating the functionality of implementing real-time learning and/or optimization of the dynamic pressure response in the processing chamber 102 according to embodiments of the present technology. It is noted that alternative embodiments may alter the functionality illustrated to add, remove, combine, separate, and/or rearrange the various operations shown. A person of ordinary skill in the art will appreciate such variations. Prior to implementing the functionality shown in FIG. 2, the system controller 170 of the processing system 100 may receive a processing recipe for processing a substrate in the processing chamber 102. The processing recipe may include two or more recipe steps. The transition from one step to another may involve change in one or more recipe parameters, e.g., gas chemistry, flow rate, RF power, mode of power delivery, pressure set-point, etc., and pressure transients may occur at the step transitions. In some embodiments, prior to implementing the functionality shown in FIG. 2, a substrate may be loaded into the processing chamber 102 and may be supported by the substrate support 106. However, the substrate may be loaded into the processing chamber 102 at any time prior to the processing being started. In some embodiments, an user interface, such as a pressure calibration program interface, may be implemented. For example, the processing unit 172 may execute the recipe logic 176 to implement the pressure calibration program interface.

At block 205, the pressure calibration program interface may allow the user to select whether a pressure calibration program may be run. The pressure calibration program, as will be discussed below, may implement the real-time learning and/or optimization of the pressure response in the processing chamber 102. If the user may elect not to run the pressure calibration program, at block 210, the substrate may be processed in accordance with the processing recipe without real-time pressure response learning. If the user may elect to run the pressure calibration program, at block 215, the pressure calibration program interface may further allow the user to select one or more recipe steps to implement the pressure calibration via real-time learning of the pressure response in the processing chamber 102. At block 220, the processing of the substrate may begin in accordance with the processing recipe.

While the substrate may be processed, real-time learning of the dynamic pressure response at the selected recipe steps may be implemented by executing the real-time learning control logic 182. Execution of the real-time learning control logic 182 may cause measurements of the dynamic pressure response for the selected recipe steps to be taken in real time using one or more of the sensors 160 of the processing system 100 at block 225. As mentioned above, one or more recipe parameters may change from one recipe step to another. When the one or more recipe parameters may change or may be in a state of flux during a step transition between two recipe steps, disturbance to the pressure in the processing chamber 102 may occur. The pressure sub-system 140 may move and/or modify the motion of the valve 144 in response to such disturbance. The motion of valve 144 may effectuate a dynamic pressure response until a steady, equilibrium state may be achieved. The real-time measurement of the dynamic pressure response at the recipe step transitions may be acquired by the processing unit 172 via the communications interface 180 and may be utilized by the real-time learning control logic 182 to learn and account for un-modeled aspects of the dynamic pressure response.

At block 230, deviations and/or errors of the measured dynamic pressure response may be determined. In some embodiments, the control logic 178 may further include one or more algorithms stored as executable instructions or code for determining deviations and/or errors of the real-time dynamic pressure response. As mentioned above, an expected behavior or pressure response may be provided by the model-based control logic 180. Deviations from the expected pressure response or set-point may arise due to the change in one or more recipe parameters causing disturbance to the pressure in the processing chamber 102 during recipe step transitions. Deviations and/or errors of the measured dynamic pressure response may also arise due to un-modeled pressure control aspects.

In some embodiments, the deviations and/or errors of the dynamic pressure response may be evaluated by comparing the measured real-time dynamic pressure response to the expected pressure response. In some embodiments, the deviations and/or errors of the dynamic pressure response may be determined by comparing the measured real-time dynamic pressure response to the pressure set-point at the equilibrium state of the processing chamber 102. For example, in some embodiments, the deviations and/or errors may be calculated by dividing the measured one or more pressure overshoots by the pressure set-point for the select recipe steps. The calculated deviations and/or errors may then be compared to a threshold value, which may be 10%, 5%, 3%, 2%, or 1%, or any other threshold values depending on the processing recipe and/or the respective recipe steps.

In some embodiments, the deviations and/or errors may also be evaluated by comparing the measured dynamic pressure response to the modeled pressure response to determine whether the measured dynamic pressure response may have resulted in a settling time that may be greater than a threshold settling time. In some embodiments, the deviations and/or errors may also be evaluated by comparing the measured dynamic pressure response to the modeled pressure response to determine whether a change in the operation of the valve 144 may have been carried out in a delayed manner or may have been carried out prematurely.

At block 235, the determined deviations and/or errors associated with the selected recipe steps may be compared to one or more threshold values as discussed above. If the deviations and/or errors may be determined to be less than or about the respective threshold values, the system controller 170 may determine at block 240 that the operation of the valve 144 for effectuating the dynamic pressure response may not be adjusted, and the real-time learning and/or optimization of the dynamic pressure response may be completed. If any of the deviations and/or errors may be determined to be greater than the corresponding threshold value, the real-time learning and/or optimization of the pressure response may be continued.

At block 245, an adjustment to the operation of the valve 144 may be calculated based on the deviations and/or errors determined, e.g., overshoot above the pressure set-point, overshoot below the pressure set-point, etc. The calculated adjustment may include adjustment to the motion of the valve 144, such as speed of motion, direction of motion, range of motion, etc., to reduce the deviations and/or errors in the dynamic pressure response in subsequent runs. The adjustment to the valve motion behavior can be calculated based on any variety of algorithms or combinations of algorithms based on established control system methodologies, as well as any other type of appropriate methodologies that can produce the desired result of reducing the pressure errors as would be appreciated by one with ordinary skill in the art.

As a non-limiting example of calculating the adjustment to the valve operation, one or more attributes dependent from or related to the pressure response may be measured and/or derived. Such pressure-response-dependent attributes may include pressure set-point change from one step to another, pressure overshoot or deviation from the target pressure set-point, peak-to-peak amplitude of pressure transients, or any other attributes that may quantitatively represent the pressure disturbance and/or pressure error during recipe step transitions. The one or more pressure-response-dependent attributes measured and/or derived from a recipe run, such as an initial recipe run, may be used to determine and/or calculate a change or adjustment in the valve motion in subsequent runs so as to modify and/or negate the pressure disturbance or pressure error in the subsequent runs. Consequently, when the change or adjustment to the valve motion may be implemented in subsequent runs, pressure disturbance may be modified, pressure error may be reduced, and/or pressure response may be optimized.

As another non-limiting example, the disturbance to the pressure may be modeled as a function of additional feed-forward inputs, such as RF power, flow rates, etc., to improve the prediction of the disturbance injected into the chamber system during recipe step transitions. Based on appropriate feedback information, such as the error in the pressure response during a recipe run, the parameters for modeling the disturbance to the pressure may be updated to adjust the valve operation for subsequent runs and to better estimate the disturbance injected. The model parameters may be further adjusted based on the feedback information on the pressure errors obtained in subsequent runs to further adjust the operation of the valve until the model parameters and the operation of the valve may be optimized to optimize the pressure response.

As already mentioned above, the calculation of the adjustment to the valve operation or motion behavior may not be limited to any single algorithm or any combinations of algorithms. Rather, any control system algorithms or combinations of control system algorithms may be implemented to design a pressure control system architecture such that the deviations and/or pressure errors from previous runs of a processing recipe can be utilized as feedback information to improve the dynamic pressure response. Stated differently, the methods described herein may allow for improvement in the performance of a complex and highly non-linear system, such as the dynamic pressure response in the processing chamber during recipe step transitions, based on information obtained from prior runs of the processing recipe.

At block 250, the pressure control may be updated to incorporate the adjustment to the operation of the valve 144 for a subsequent run of the processing recipe to process a different or second substrate. Due to the high repeatability of the dynamic pressure response from run to run, the calculated adjustment, when updated and implemented in subsequent runs, may reduce the deviations and/or errors in the dynamic pressure response.

Once the subsequent or second substrate may be loaded into the processing chamber 102, the processing of the second substrate may begin at block 220 in accordance with the processing recipe. During the step transitions between the selected recipe steps, the calculated adjustment to the valve operation may be implemented to improve the dynamic pressure response. The dynamic pressure response may then be measured in real time at block 225, and deviations and/or errors may be determined at block 230 and compared to threshold values at block 235. If needed, further adjustment to the valve operation may be calculated at block 245 and updated at block 250 until the deviations and/or errors may be determined to be less than or about the threshold values, and the operation of the valve 144 may not be further adjusted. The learned operating parameters for the valve 144 may then be updated for the given recipe to subsequent runs. The functionalities of blocks 220-250 may be repeated for a third or any number of subsequent substrates until an optimal pressure response may be achieved, such as when the deviations and/or errors may be below the threshold values. The real-time learning and/or optimization of the dynamic pressure response may be completed.

Figure 3A:
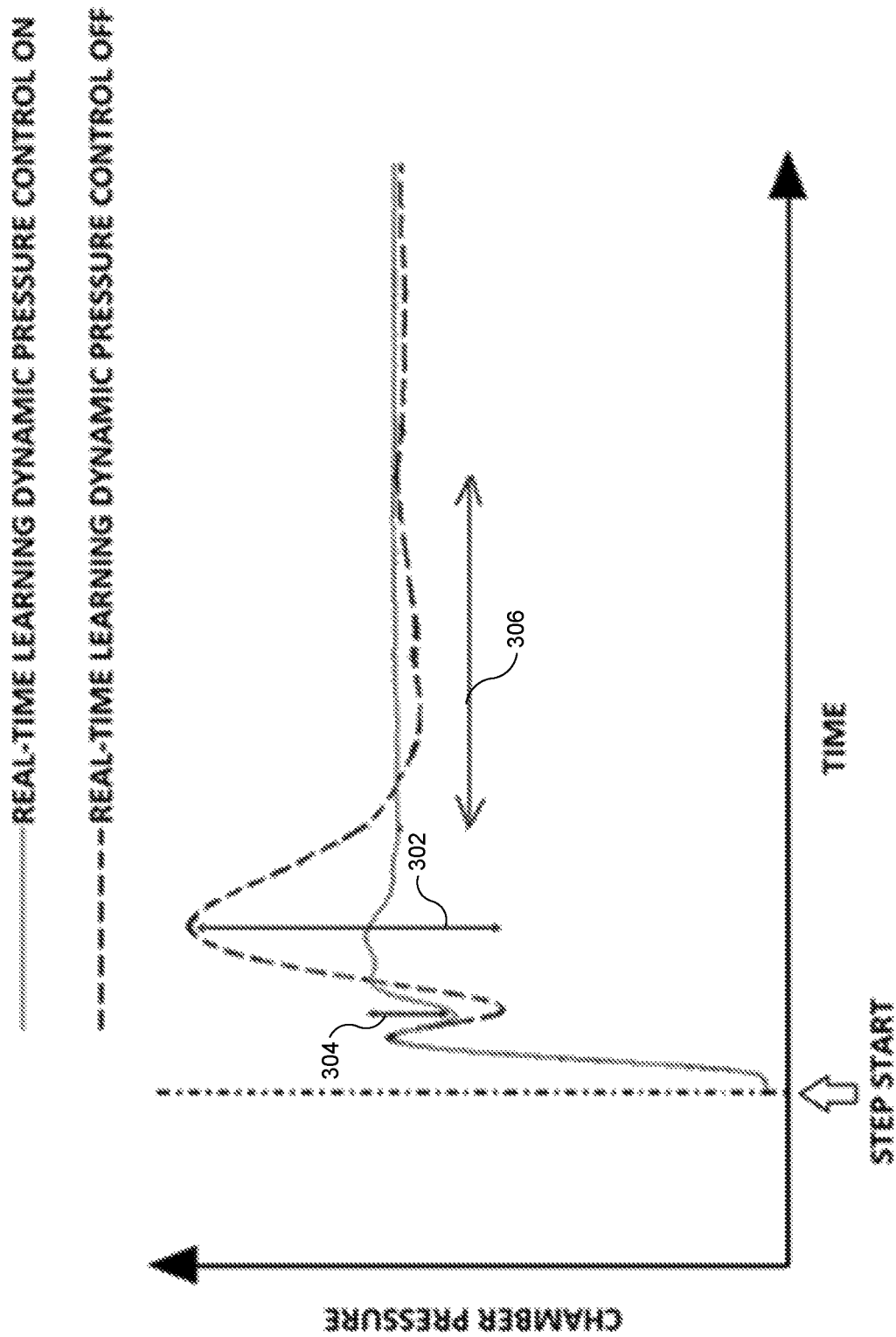
FIGS. 3A and 3B show exemplary dynamic pressure responses according to some embodiments of the present technology.
Figure 3B:
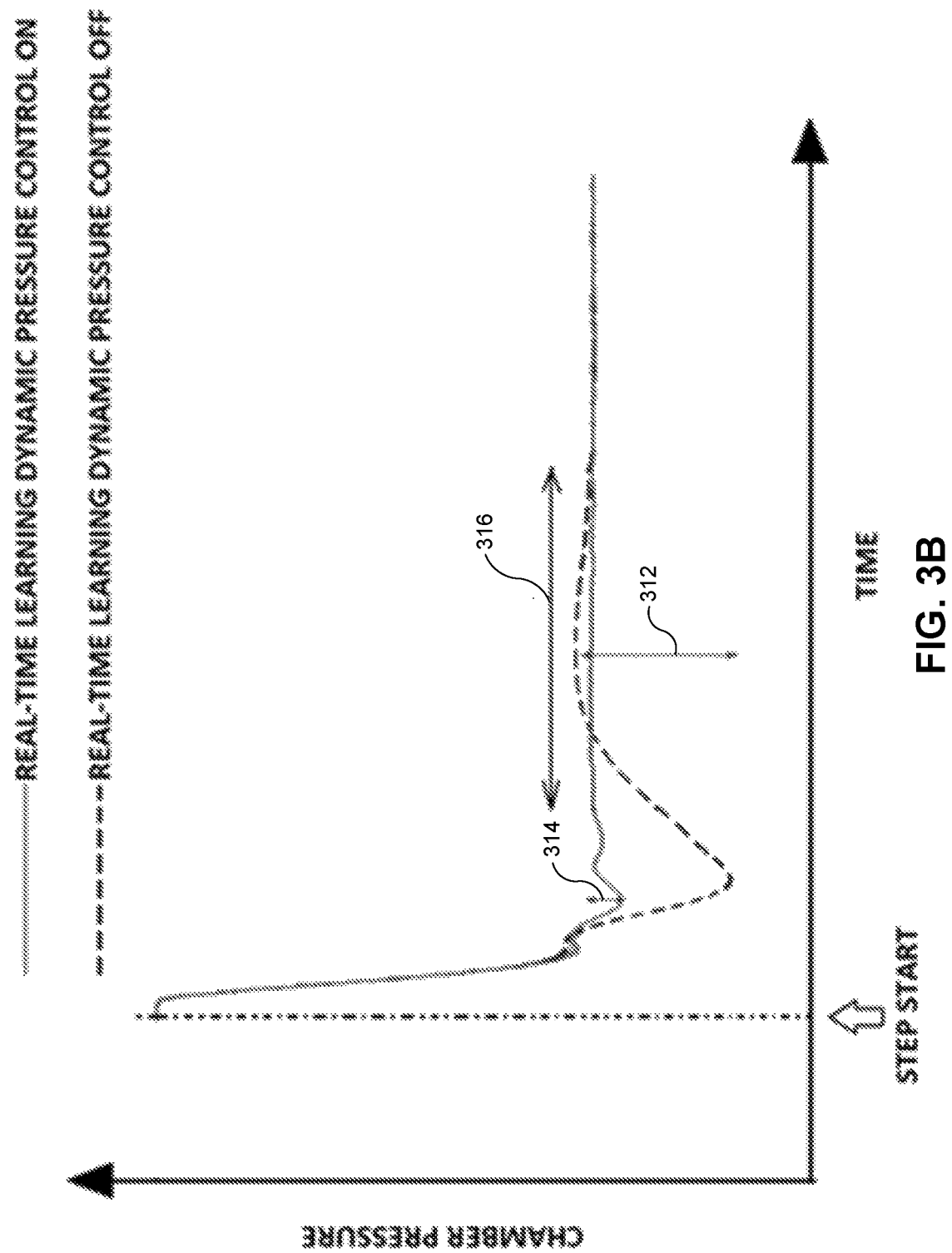

By implementing the real-time learning and/or optimization of the pressure response, an optimized pressure response may be achieved. The optimized pressure response may have reduced response deviations and/or errors and/or may stabilize faster to a steady state. FIGS. 3A and 3B show exemplary dynamic pressure responses according to some embodiments of the present technology. FIG. 3A shows the dynamic pressure response when the pressure set-point in a subsequent recipe step may be increased. FIG. 3B shows the dynamic pressure response when the pressure set-point may be decreased. In both FIGS. 3A and 3B, the dash line represents the dynamic pressure response when no real-time learning and/or optimization of the pressure response has been implemented, and the solid line represents the dynamic pressure response after the real-time learning and/or optimization of the pressure response has been implemented.

As shown, by implementing real-time learning and/or optimization of the pressure response, the peak-to-peak amplitude of the pressure transients may be significantly reduced. In some embodiments, the peak-to-peak amplitude without implementing the real-time learning and/or optimization, such as the peak-to-peak amplitude 302 in FIG. 3A and the peak-to-peak amplitude 312 in FIG. 3B, may be reduced by at least about 50%, at least about 60%, at least about 70%, at least about 80%, at least about 90%, at least about 95%, or greater, after implementing the real-time learning and/or optimization to achieve a much reduced peak-to-peak amplitude, such as the peak-to-peak amplitude 304 in FIG. 3A and the peak-to-peak amplitude 314 in FIG. 3B.

By implementing real-time learning and/or optimization of the pressure response, the settling time of the pressure transients may also be significantly reduced, as shown by the settling time reduction 306 FIG. 3A and the settling time reduction 316 in FIG. 3B. In some embodiments, the settling time without the implementing real-time learning and/or optimization may be reduced by at least about 50%, at least about 60%, at least about 70%, at least about 80%, at least about 90%, at least about 95%, or greater, by implementing the real-time learning and/or optimization. A ratio of the settling time without implementing the real-time learning and/or optimization to the settling time after implementing the real-time learning and/or optimization may be greater than 1:1, greater than or about 1.5:1, greater than or about 2:1, greater than or about 3:1, greater than or about 4:1, greater than or about 5:1, greater than or about 10:1, greater than or about 15:1, greater than or about 20:1, greater than or about 50:1, greater than or about 100:1, or greater. The reduced settling time may lead to improved processing throughput.

By implementing the real-time learning and/or optimization, the pressure overshoot may be reduced, which may improve plasma stability during the processing. For example, when the pressure may be reduced to reach a new pressure set-point, such as in the case of FIG. 3B, a significant amount of overshoot may occur, which may cause the chamber pressure to drop to a level that may result in plasma instability.

Further, by taking real-time measurements of the pressure inside the processing chamber, the present technology may learn and account for un-modeled aspects of the dynamic pressure response. The present technology may be implemented to optimize the dynamic pressure response during a recipe step transition when any form of disturbance may be introduced into the processing chamber, such as disturbances due to gas flow rate change, pressure change, RF power change, etc. By implementing real-time learning of errors that may be present in the pressure response in each chamber, the present technology may further allow for matching of the pressure response across multiple chambers. Thus, the real-time learning and/or optimization described herein may account for hardware and/or manufacturing variations in the chambers and may only depend on the processing recipe parameters and the type of pressure transition involved. Further, because the control signals and measured sensor inputs may be transmitted via a fast update communications interface, run-to-run variability may be minimized, and data collected during any recipe run may be studied and utilized to determine whether the dynamic pressure response may be optimized to reduce pressure response deviations and/or errors.

Figure 4:
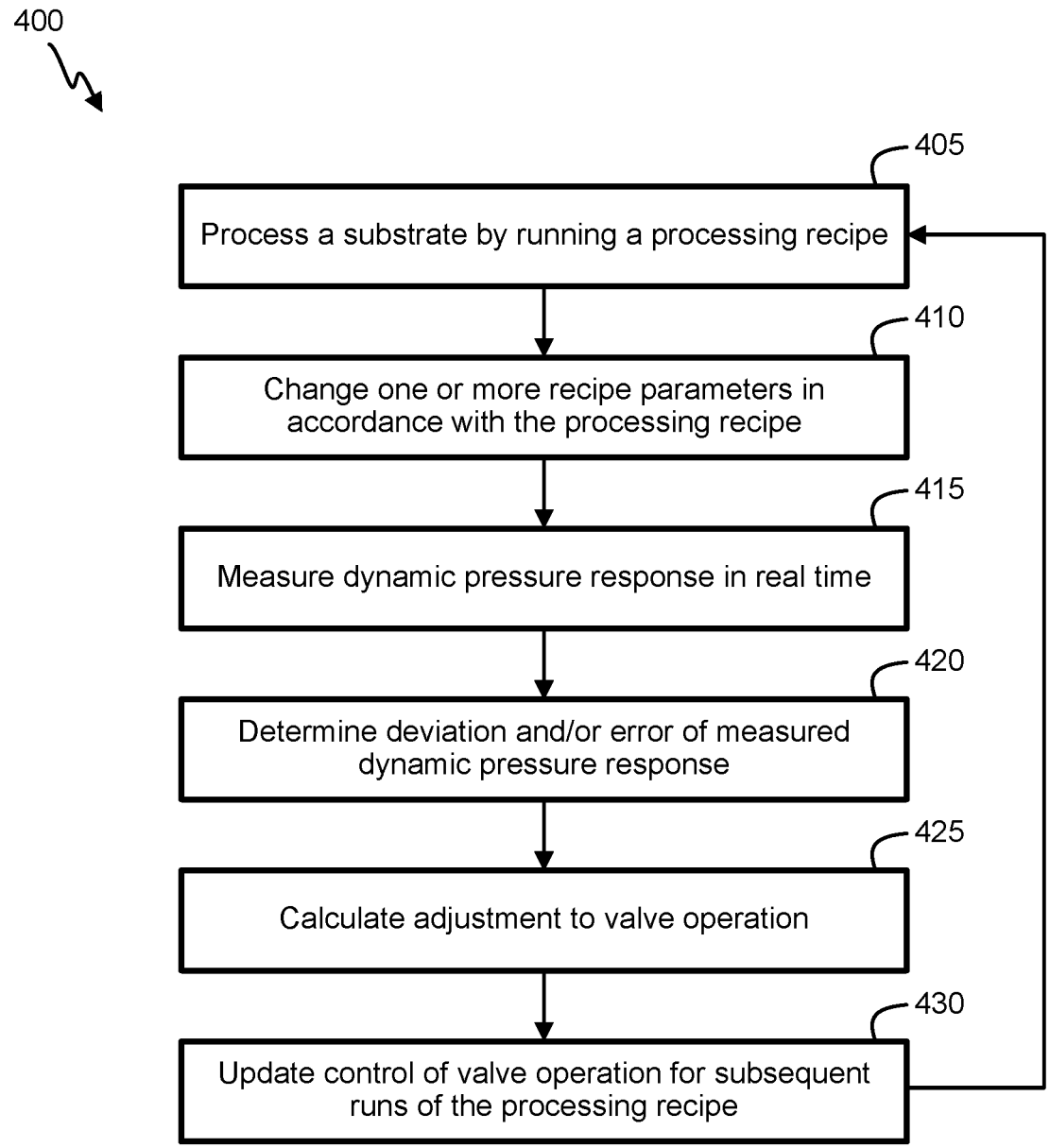
FIG. 4 shows exemplary operations in a method for real-time learning and/or optimization of a dynamic pressure response in a processing chamber of a processing system according to embodiments of the present technology.

FIG. 4 shows exemplary operations in a method 400 for real-time learning and/or optimization of a dynamic pressure response in a processing chamber of a processing system according to embodiments of the present technology. An exemplary processing system may be the processing system 100 previously described. Thus, the processing system may include some or all aspects and features of the processing system 100 described above. An exemplary processing chamber may be the processing chamber 102 previously described. Thus, the processing chamber may include some or all aspects and features of the processing chamber 102 described above. Prior to initiation of method 400, a substrate may be loaded into the processing chamber. The substrate may be processed in accordance with a processing recipe. The processing recipe may include two or more recipe steps. The transition from one step to another may involve change in one or more recipe parameters, e.g., gas chemistry, flow rate, RF power, mode of power delivery, pressure set-point, etc.

At block 405, method 400 may include processing the substrate by running the processing recipe. At operation 410, method 400 may include changing one or more of the recipe parameters in accordance with the processing recipe while running the processing recipe on the substrate in the processing chamber. In some embodiments, processing the substrate in accordance with the processing recipe may include generating a plasma in the processing chamber in accordance with the processing recipe. Thus, the recipe parameters may include an RF power of the plasma generated in the processing chamber. In some embodiments, processing the substrate in accordance with the processing recipe may include flowing a process gas into the processing chamber in accordance with the processing recipe. Thus, the recipe parameters may include a flow rate of the processing gas flowed into the processing chamber. The recipe parameters changed at operation 410 thus may include the RF power and/or the flow rate of the process gas. Processing the substrate in accordance with the processing recipe may involve various other semiconductor processing operations. The recipe parameters that may be changed at operation 410 may include gas chemistry, gas flow rates, gas flow ratios, RF powers, modes of power delivery, pressure set-points, etc.

At operation 415, method 400 may include measuring the dynamic pressure response in the processing chamber in response to the changing of the one or more recipe parameters. The measurements may be take in real time for real-time learning of the dynamic pressure response.

The measurements may be communicated to a processing unit of the processing system for analysis via a communications interface, such as the communications interface 180 described above. The communications interface may allow for fast data update and control signal synchronization such that run-to-run variability for a given recipe may be limited.

At operation 420, method 400 may include determining a pressure response deviation and/or error based on the real-time measurements of the pressure response. In some embodiments, the pressure response deviation and/or error may be determined by comparing the measured pressure response to a model pressure response that may be calculated based on the processing recipe.

At block 425, in response to determining that the response error may be greater than a threshold value, method 400 may further include calculating an adjustment to an operation of a valve downstream of the processing chamber to improve or optimize the dynamic pressure response in subsequent runs of the processing recipe. At block 430, method 400 may further include updating the control of the valve operation based on the calculated adjustment such that the adjustment may be applied when changing the recipe parameters in a subsequent run of the processing recipe. During the subsequent run of the processing recipe, only the operation of the valve may be adjusted, and the processing recipe may not be changed.

In some embodiments, after operation 430, another or a second substrate may be loaded in the processing chamber. Some or all of operations 405-430 may be performed again to process the second substrate. By applying the calculated adjustment to the valve operation, improved dynamic pressure response, e.g., reduced response deviation and/or error, reduced settling time, etc., may be achieved. In some embodiments, method 400 may be performed in cycles until the response deviation and/or error may be determined to be below the threshold value. The pressure response optimization may then be completed, and the valve operation may not be further adjusted.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A non-transitory machine readable medium having instructions stored thereon, wherein the instructions are executable by one or more processors of a control system of a processing chamber to cause the control system to:
   receive measurements indicative of a first pressure response in the processing chamber responsive to changing of at least one of a plurality of recipe parameters in accordance with a processing recipe being run on a first semiconductor substrate;
   determine a first response error based on the first pressure response and a model pressure response calculated based on the processing recipe, wherein the model pressure response is generated as a feedforward control signal while running the processing recipe by a model that predicts a pressure in the chamber in response to changing the at least one of the plurality of recipe parameters; and
   in response to determining that the first response error is greater than a threshold value, calculate an adjustment to an operation of a valve downstream of the processing chamber to be applied when changing the at least one of the plurality of recipe parameters in accordance with the processing recipe in a subsequent run of the processing recipe.

2. The non-transitory machine readable medium of claim 1, wherein the instructions are executable by the one or more processors of the control system to further cause the control system to:
   cause a process gas to flow into the processing chamber in accordance with the processing recipe, wherein the at least one of the plurality of recipe parameters comprises a flow rate of the processing gas flowed into the processing chamber.

3. The non-transitory machine readable medium of claim 1, wherein the instructions are executable by the one or more processors of the control system to further cause the control system to:
   cause the processing recipe to be run on a second semiconductor substrate in the processing chamber;
   change the at least one of the plurality of recipe parameters in accordance with the processing recipe being run on the second semiconductor substrate; and
   apply the adjustment to the operation of the valve when changing the at least one of the plurality of recipe parameters in accordance with the processing recipe being run on the second semiconductor substrate.

4. The non-transitory machine readable medium of claim 3, wherein the adjustment to the operation of the valve is applied without changing the processing recipe.

5. The non-transitory machine readable medium of claim 3, wherein the instructions are executable by the one or more processors of the control system to further cause the control system to:
   receive a measurement of a second pressure response in the processing chamber responsive to the changing of the at least one of the plurality of recipe parameters in accordance with the processing recipe being run on the second semiconductor substrate and the application of the adjustment to the operation of the valve; and
   determine a second response error based on the second pressure response and the model pressure response.

6. The non-transitory machine readable medium of claim 5, wherein the instructions are executable by the one or more processors of the control system to further cause the control system to:
   in response to determining that the second response error is greater than the threshold value, calculate another adjustment to be made to the operation of the valve when changing the at least one of the plurality of recipe parameters in accordance with the processing recipe in another subsequent run of the processing recipe.

7. The non-transitory machine readable medium of claim 5, wherein a settling time of the second pressure response is less than a settling time of the first pressure response.

8. The non-transitory machine readable medium of claim 5, wherein an overshoot of the second pressure response is less than an overshoot of the first pressure response.

9. The non-transitory machine readable medium of claim 1, wherein the instructions are executable by the one or more processors of the control system to further cause the control system to:
   cause the processing chamber to generate a plasma in the processing chamber in accordance with the processing recipe, and wherein the at least one of the plurality of recipe parameters comprises an RF power of the plasma generated in the processing chamber.

10. The non-transitory machine readable medium of claim 1, wherein the instructions are executable by the one or more processors of the control system to further cause the control system to:
    activate an actuator of the valve to applying the adjustment to the operation of the valve when changing the at least one of the plurality of recipe parameters in accordance with the processing recipe being run on a second semiconductor substrate.

11. The non-transitory machine readable medium of claim 10, wherein the adjustment to the operation of the valve is applied without changing the processing recipe.

12. A semiconductor processing system comprising:
    a processing chamber;
    a valve downstream of the processing chamber, wherein the valve is operable to change a pressure of the processing chamber; and
    a control system configured to:
       receive measurements indicative of a first pressure response in the processing chamber responsive to changing of at least one of a plurality of recipe parameters in accordance with a processing recipe being run on a first semiconductor substrate;
       determine a first response error based on the first pressure response and a model pressure response calculated based on the processing recipe, wherein the model pressure response is generated as a feedforward control signal while running the processing recipe by a model that predicts a pressure in the chamber in response to changing the at least one of the plurality of recipe parameters; and in response to determining that the first response error is greater than a threshold value, calculate an adjustment to an operation of the valve to be applied when changing the at least one of the plurality of recipe parameters in accordance with the processing recipe in a subsequent run of the processing recipe.

13. The semiconductor processing system of claim 12, further comprising a fast update communications interface configured to communicate:

the measurements indicative of the first pressure response in the processing chamber to the control system; and a control signal from the control system to apply the adjustment to the operation of the valve.

14. The semiconductor processing system of claim 12, wherein the at least one of the plurality of recipe parameters comprises at least one of an RF power of a plasma generated in the processing chamber or a flow rate of a processing gas flowed into the processing chamber.

15. The semiconductor processing system of claim 12, wherein the control system is further configured to:

activate an actuator of the valve to apply the adjustment to the operation of the valve when changing the at least one of the plurality of recipe parameters in accordance with the processing recipe being run on a second semiconductor substrate.

16. The semiconductor processing system of claim 15, wherein the adjustment to the operation of the valve is applied without changing the processing recipe.

17. The semiconductor processing system of claim 15, wherein the control system is further configured to:

receive measurements indicative of a second pressure response in the processing chamber responsive to the changing of the at least one of the plurality of recipe parameters in accordance with the processing recipe being run on the second semiconductor substrate and the application of the adjustment to the operation of the valve; and determine a second response error based on the second pressure response and the model pressure response.

18. The semiconductor processing system of claim 17, wherein the control system is further configured to:

in response to determining that the second response error is greater than the threshold value, calculate another adjustment to be made to the operation of the valve when changing the at least one of the plurality of recipe parameters in accordance with the processing recipe in another subsequent run of the processing recipe.

* * * * *